United States Patent [19]  
Ghezzo et al.

[11] 4,378,565  
[45] Mar. 29, 1983

[54] INTEGRATED CIRCUIT AND METHOD OF MAKING SAME

[75] Inventors: Mario Ghezzo, Ballston Lake; Ronald T. Jerdonek, Scotia, both of N.Y.

[73] Assignee: General Electric Company, Schenectady, N.Y.

[21] Appl. No.: 192,881

[22] Filed: Oct. 1, 1980

[51] Int. Cl.$^3$ ............................................ H01L 29/78
[52] U.S. Cl. .................................. 357/23; 357/41; 357/49; 357/51
[58] Field of Search .................. 357/23 C, 23 CS, 41, 357/49, 51

[56] References Cited

U.S. PATENT DOCUMENTS 4,131,906 12/1978 Kinoshita ........................ 357/23 X
4,317,273 3/1982 Guterman ........................ 357/41 X Primary Examiner—Martin H. Edlow
Attorney, Agent, or Firm—Julius J. Zaskalicky; James C. Davis, Jr.; Marvin Snyder

[57] ABSTRACT

An integrated circuit structure for reducing propagation delay is described. Integrated circuits include at least a pair of regions in each of which are located a respective plurality of functional cells and which are spaced apart by an interconnection region in which interconnection lines are provided connecting elements of the functional cells of one functional cell region with elements of the functional cells of the other functional cell region. Field oxide is provided in the interconnection region substantially greater in thickness than the field oxide in the regions of the functional cells thereby substantially reducing the capacitance and hence propagation delay of the interconnection lines. Formation of the field oxide of the interconnection region independent of the formation of the field oxide in the functional cell regions enables optimization of the field oxide in the interconnection region for minimum propagation delay without compromising functional cell formation in the functional cell regions.

1 Claim, 8 Drawing Figures

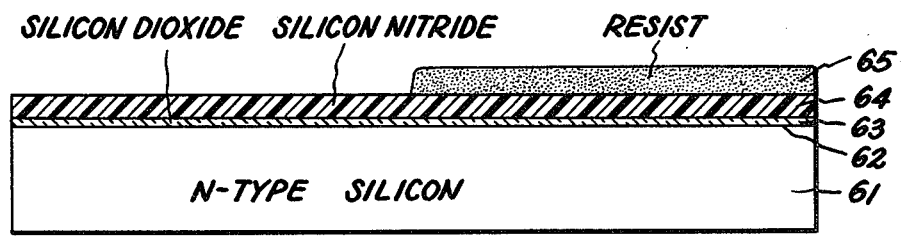
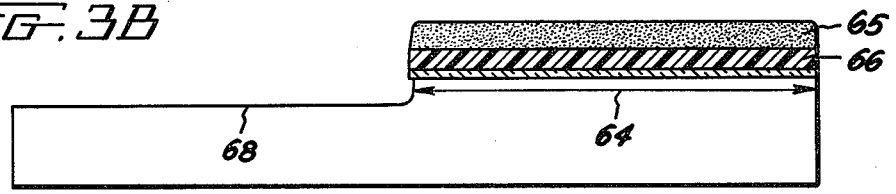
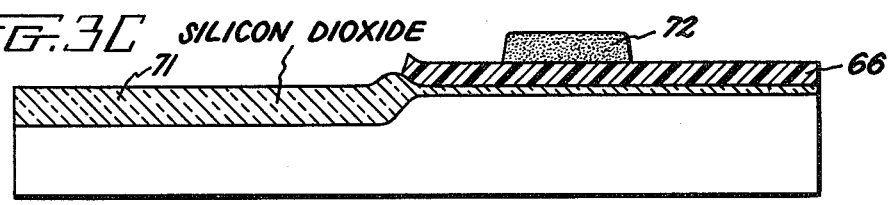
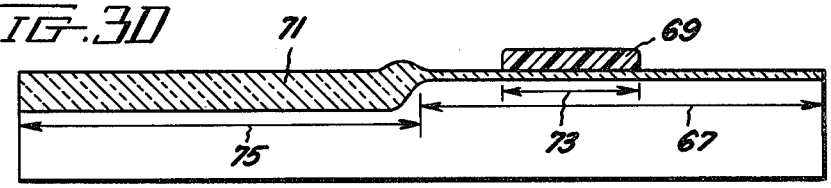
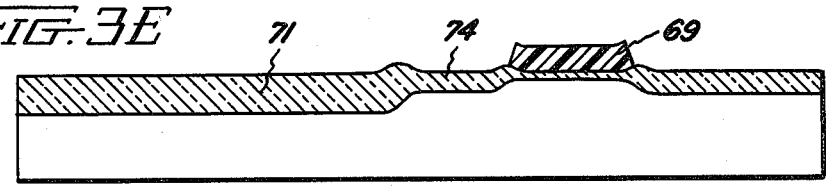
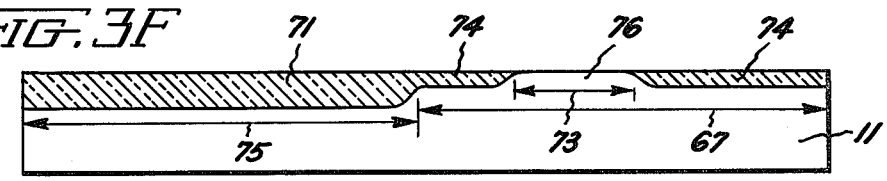

INTEGRATED CIRCUIT AND METHOD OF MAKING SAME

The present invention relates in general to integrated circuits and in particular integrated circuit structures and a method of making such integrated circuit structures.

In very large scale integrated circuits utilizing a metal oxide semiconductor structure, improvements in the speed of operation thereof have been sought and obtained through size reduction of the functional elements or logic gates thereof by increasing the conductivity of the electrode materials utilized for interconnection and by use of epitaxially grown silicon bodies on insulating substrates of such materials as sapphire. The advantage of insulating substrate materials, such as sapphire, is that a reduction of parasitic capacitance is obtained both at the source and drain junctions of the active devices formed in the silicon semiconductor bodies and along the interconnections thereof. This has been realized by interfacing the bottom surfaces of these components with the top surface of the insulating substrate of sapphire. Although such technology achieves this goal of reducing parasitic capacitances very effectively, it is costly and less reliable than conventional silicon bulk technology for making the metal oxide semiconductor integrated circuits.

Accordingly, an object of the present invention is to provide integrated circuit devices in silicon bulk technology in which the upper speed limit, as set by propagation delays in the interconnections thereof, is increased.

Another object of the present invention is to provide improvements in the process of making in silicon bulk technology integrated circuit devices having improved performance characteristics.

In accordance with one embodiment of the present invention there is provided a substrate of semiconductor material having a major surface. A first surface adjacent region of the substrate contains a first part of the major surface. A second surface adjacent region of the substrate is spaced apart from the first surface adjacent region and contains a second part of the major surface. A third surface adjacent region is contiguous to the first surface adjacent region and the second surface adjacent region and contains a third part of the major surface. A first plurality of thin layers of silicon dioxide is provided, each thin layer overlying a respective first surface portion of the first surface adjacent region. A second plurality of thin layers of silicon dioxide is provided, each thin layer overlying a respective first surface portion of the second surface adjacent region. A first thick layer of silicon dioxide is provided overlying a second surface portion of the first surface adjacent region. A second thick layer of silicon dioxide is provided overlying a second surface portion of the second surface adjacent region. A third thick layer of silicon dioxide is provided overlying the third part of the major surface of the substrate. The thickness of the third thick layer of silicon dioxide is substantially greater than the thickness of the first and second thick layers of silicon dioxide. A first plurality of functional cells are formed in the first surface adjacent region, each functional cell overlying a respective first surface portion thereof. A second plurality of functional cells are formed in the second surface adjacent region, each functional cell overlying a respective first surface portion thereof. A plurality of conductive lines are provided interconnecting elements of the functional cells located in the first surface adjacent region with the elements of the functional cells located in the second surface adjacent region. Each of the conductive lines insulatingly overlie the third surface adjacent region.

In carrying out the method of the present invention, there is provided a substrate of silicon semiconductor material of one conductivity type having a major surface. A thick layer of silicon nitride is provided insulatingly overlying the major surface. The layer of silicon nitride is patterned to provide a first retained portion thereof insulatingly overlying a first part of the major surface. The portion of the silicon substrate uncovered by the patterning of the layer of silicon nitride is heated in an oxidizing atmosphere to a temperature and for a time to cause the silicon semiconductor material to be converted to silicon dioxide to form at least a part of a thick layer of silicon dioxide overlying a third part of the major surface. The first retained portion of the layer of silicon nitride is then patterned to provide second retained portions thereof each overlying and in registry with a respective first surface portion of the substrate. The substrate is again heated in an oxidizing atmosphere to a temperature and for a time to cause the silicon substrate material unmasked by the second retained portions of the layer of silicon nitride to be converted to silicon dioxide to form another thick layer of silicon dioxide insulatingly overlying the first part of the major surface and to augment the thickness of the aforementioned one thick layer of silicon dioxide. Thereafter, the second retained portions of the layer of silicon nitride are removed and functional cells are formed in the first surface portions.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

FIGS. 3A–3F show cross sections of structures representing successive steps in one method of fabricating the composite structure of FIG. 1 in accordance with the present invention.

Figure 1:
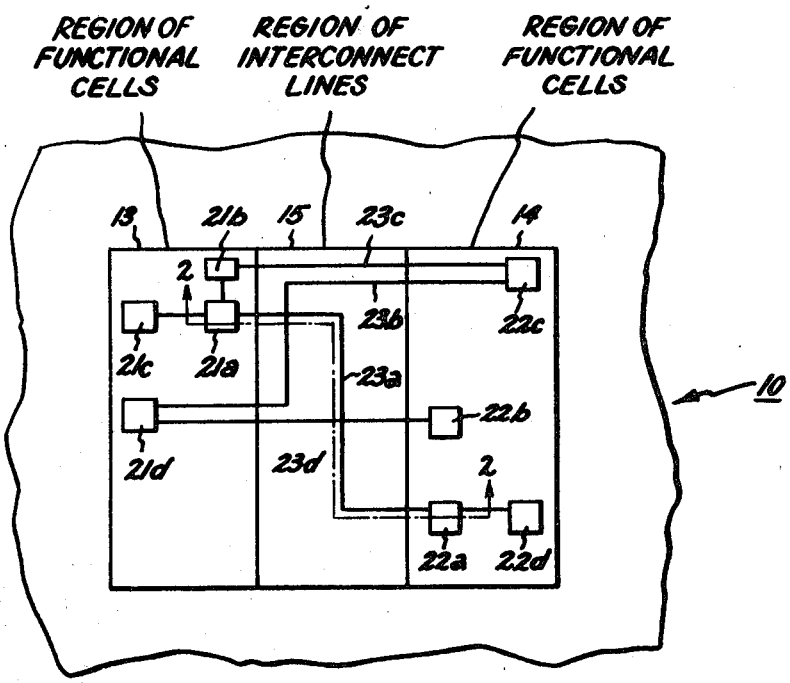
FIG. 1 is a plan view of a composite structure or section of an integrated circuit showing first and second regions in each of which functional cells are located and showing a third region over which interconnections between the functional cells of the first and second regions are made.
Figure 2:
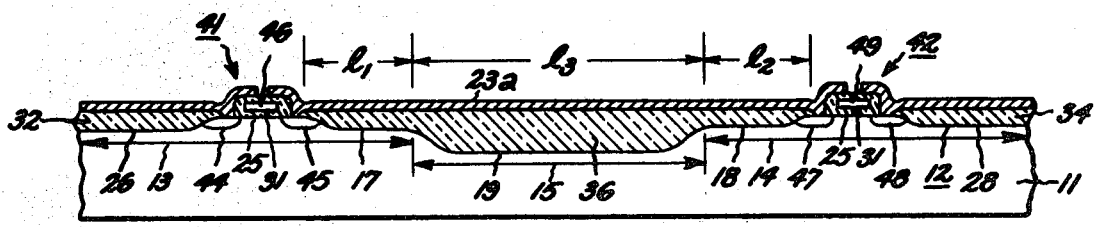
FIG. 2 is a cross-sectional view of a section of the substrate of FIG. 1 taken along section lines 2—2 thereof.

Referring now to FIGS. 1 and 2, there is shown a portion of an integrated circuit structure 10 including a substrate 11 having a major surface 12. A first surface adjacent region 13 of the substrate contains a first part 17 of said major surface. A second surface adjacent region 14 of the substrate is spaced apart from said first surface adjacent region contains a second part 18 of the major surface. A third surface adjacent region 15 is contiguous to the first surface adjacent region 13 and the second surface adjacent region 14, and contains a third part 19 of the major surface. A first plurality of functional cells, only four (21a–21d) of which are shown in the first surface adjacent region 13. A second plurality of functional cells, only four (22a–22d) of which are shown are located in the second adjacent region 14. By a functional cell is meant a circuit element such as a field effect transistor or logic gates including a plurality of circuit elements. The functional cells of the first surface adjacent region 13 are connected to functional cells of the second surface adjacent region 14 by conductive lines, only four (23a–23d) of which are shown insulatingly overlying the third surface adjacent region 15 of the substrate. The functional cells may form a series of logic gates providing logic functions.

A first plurality of thin layers of silicon dioxide 31 are provided, each overlying a respective first surface portion 25 of the first surface adjacent region 13. A first thick layer 32 of silicon dioxide is provided overlying a second surface portion 26 of the first surface adjacent region 13 and contiguous to the various thin layers 31 of silicon dioxide. A second plurality of thin layers 31 of silicon dioxide are provided, each overlying a respective first surface 25 portion of the second surface adjacent region 14. A second thick layer 34 of silicon dioxide is provided overlying a second surface portion 28 of the second surface adjacent region 14 and contiguous to the various thin layers 31 of silicon dioxide. The third surface adjacent region 15 includes a third surface portion 19 or part over which is provided a third thick layer 36 of silicon dioxide. The second thick layer 36 of silicon dioxide is substantially thicker than the first thick layers 32 and 34 of silicon dioxide overlying the first and second adjacent regions 13 and 14, for reasons which will be explained below.

Reference is now made particularly to FIG. 2 which is a sectional view of a portion of the integrated circuit of FIG. 1 taken along section lines 2—2 thereof showing a pair of functional cells in the form of field effect transistors 41 and 42. Field effect transistor 41 is formed in the first surface adjacent region 13 and the field effect transistor 42 is formed in the second surface adjacent region 14 and connected to the first functional cell over a conductive line 23a extending over the third surface adjacent region 15. The first transistor 13 includes a source 44, a drain 45 and a gate 46. The second transistor 42 includes a source 47, a drain 48 and a gate 49. The drain 45 of transistor 41 is connected over a conductive line 23a to the source 47 of transistor 42. The conductive line 23a has a first portion designated $l_1$ extending over the first thick layer 32 of silicon dioxide of the first surface adjacent region 13, a second portion $l_2$ extending over the second thick layer 34 silicon dioxide of the surface adjacent region 14 and a third portion $l_3$ extending over a portion of the third thick layer 36 of silicon dioxide overlying the surface adjacent region 15. The propagation delay of a signal over the line 23a from the drain 45 of the transistor 41 to the source 47 of the transistor 42 is given approximately by the formula $$\tau = R_s C_{01} l_1^2 + R_s C_{02} l_2^2 + R_s C_{03} l_3^2, \quad (1)$$

where $l_1$ is equal to the length of the conductor 23a over the first thick layer 32 of silicon dioxide of the first surface adjacent region 13.

$l_2$ is the length of the conductor 23a over the second thick layer 34 of silicon dioxide of the second surface adjacent region 14.

$l_3$ is the length of the conductor 23a over the third thick layer 36 of silicon dioxide of the third surface adjacent region 15.

$R_s$ is the sheet resistance of the conductive material of the conductor 23a.

$C_{01}$ is the capacitance per unit area of the conductor 23a with respect to the substrate over the first thick layer 32 of silicon dioxide of the first surface adjacent region 13.

$C_{02}$ is the capacitance per unit area of the conductor 23a over the second thick layer 34 of silicon dioxide overlying the second surface adjacent region 14.

$C_{03}$ is equal to the capacitance of the conductor overlying the third thick layer 36 of silicon dioxide of the third surface adjacent region 15.

The length of the conductive portions $l_1$ or $l_2$ are a small fraction of the total length of the conductive line as $l_3$ on average is much larger than $l_1$ or $l_2$. Accordingly propagation delay to a first approximation is given by the following equation:

$$\tau = R_s C_{03} l_3^2 \quad (2)$$

In accordance with the present invention the propagation delay of integrated circuits is reduced by reducing the factor $C_{03}$, capacitance per unit area of the conductor overlying the third surface adjacent region of the substrate. This is accomplished by substantially increasing the thickness of the field oxide in this region. Conventional integrated circuits utilize a field oxide in the interconnection regions which has substantially the same thickness as in the region of the substrate in which functional cells are located. The field oxide thickness of such integrated circuits can be increased a limited amount to obtain a limited reduction in propagation delay as such increases compromises the size, location and planarity of the surface portions or active parts of the substrate in which functional cells are formed. In such circuits, use of thicker field oxide increases the "bird's beak" formations until at some thickness of field oxide the electrical characteristics of the smallest devices are sharply degraded. In accordance with the present invention two different thicknesses of field oxide are utilized, one thickness in the region in which functional cells are formed. This thickness is optimized for formation or fabrication of cells therein. Another thickness of field oxide is utilized in the interconnection region. This thickness is made substantially larger to minimize propagation delay in the interconnecting lines.

The length of conductive line $l_3$ in equation (1) is on average a large fraction of the size of chip or substrate on which the integrated circuit is formed. Thus, as chip size is increased and a larger number of functional cells are located thereon, $l_3$ on average is increased thereby increasing propagation delay. Thus, a particular need arises in such very large scale integrated circuits to not only maintain propagation delay, but to reduce it as well, to enable the circuits to operate at higher speeds. While the reductions in propagation delay can be obtained by reducing sheet resistance $R_s$ of the conductive lines, such reductions are limited substantially by the conductivity of the materials used for the conductive lines.

A method of making the composite structure or portion of the integrated circuit of FIGS. 1 and 2 in accordance with the present invention will now be described in connection with FIGS. 3A through 3F. A substrate 61 of silicon semiconductor material of 10 ohm cm resistivity and N-type conductivity having a major surface 62 parallel to a (100) crystallographic plane thereof is provided. A thin layer 63 of silicon dioxide of about 300 Angstroms thick is formed on the substrate by techniques well known in the art. For example, the silicon substrate 61 is exposed in an ambient of oxygen at atmospheric pressure and at a temperature of about 1000° C. for a period of 30 minutes. Thereafter, a thick layer 64 of silicon nitride is deposited on the surface of the thin layer 63 of silicon dioxide by techniques well known in the art, for example, by chemical vapor deposition. In this process, vapors of silane and ammonia in the ratio of 1:200 by volume in a hydrogen carrier are utilized at a temperature of 1000° C. and for a time period of several minutes to form a layer of silicon nitride about 1500 Angstroms thick. The layer 63 of silicon nitride is then patterned utilizing photolithographic masking and plasma etching techniques well known in the art to provide a retained portion which overlies and is in registry with a first surface adjacent region 67 of the substrate corresponding to first surface adjacent region 13 of FIGS. 1 and 2 in which subsequently functional cells will be formed. A suitable photoresist, such as an azide resist AZ1470 from the Shipley Company of Newton, Mass., is applied over the layer of silicon nitride. After exposure and developing of the photoresist to provide a retained portion 65 thereof, the exposed portions of the silicon nitride are plasma etched using carbon tetrafluoride with 4% oxygen to provide the retained portion 66 of the silicon nitride layer. The thin layer 62 of silicon dioxide is then etched with buffered hydrofluoric acid using the photoresist as a mask to provide a retained portion thereof in registry with surface adjacent region 67 of the substrate. Thereafter, the silicon substrate is etched using a plasma etch of carbon tetrachloride to a predetermined depth to provide a recess 68 as shown in FIG. 3B. The depth of etch of the silicon substrate is selected such that on subsequent regrowth of silicon dioxide in the recess or etched out portion of the substrate is sufficiently thick to provide a surface thereof essentially coplanar with the surface of the silicon dioxide overlying portions of the surface adjacent region 67, as shown in FIG. 3E. To attain this condition, the depth of etch is set approximately 57% of the resultant thickness of the thick layer of silicon dioxide. In the next step of the process the patterned photoresist 65 is removed and the substrate is heated in an oxidizing atmosphere to a temperature and for a time to cause the silicon in the etched out portions to be converted into a thick layer 71 of silicon dioxide, as shown in FIG. 3C, to form at least a part of a thick layer of silicon dioxide corresponding to the third thick layer 36 of silicon dioxide overlying the third surface adjacent region 15 of FIG. 2. The retained portion 66 of the silicon nitride layer is next patterned utilizing photolithographic masking and plasma etching techniques described above to provide a second retained portion 69 which overlies and is in registry with a surface portion 73 of the surface adjacent region 67 of the substrate, corresponding to first surface portion 25 of FIG. 2. After exposure and developing of the applied photoresist the patterned portion 72 thereof is obtained. The exposed portions of the layer of silicon nitride unprotected by the patterned photoresist 72 are plasma etched using carbon tetrafluoride with 4% oxygen to provide the second retained portion 69 of the layer of silicon nitride. After removing of the patterned photoresist 72 the substrate is heated in an oxidizing atmosphere to a temperature and for a time to cause the silicon of the surface action region 67 surrounding the surface portion 73 thereof to be oxidized into a thick layer 74 of silicon dioxide, corresponding to thick layer 32 of silicon dioxide of FIG. 2, and also causes further oxidation of the silicon of the surface adjacent region 75 underlying the thick layer 71 of silicon dioxide to provide additional growth of oxide therein, as shown in FIG. 3E. The retained portion 69 of silicon nitride is then removed in a suitable etch, such as hot phosphoric acid. A thin surface adjacent portion of the silicon dioxide layers overlying the substrate is then removed using a suitable etch such as buffered hydrofluoric acid to expose the top of the mesa 76 formed in the surface adjacent region 67 of the substrate, as shown in FIG. 3F. In a completed integrated circuit, functional cells are formed in the mesas and interconnection lines are provided therebetween, as shown in connection with FIGS. 1 and 2.

While in connection with FIG. 3B, a portion of the silicon substrate was etched prior to the oxidation thereof to form a portion of the thick layer 71 of silicon dioxide, it will be understood that the etching step may be dispensed with and the exposed silicon surface oxidized without prior etching of the substrate to form the thick layer 71 of silicon dioxide.

While in the integrated circuit structure and process described above, a silicon substrate of N-type conductivity is utilized, it, of course, is apparent that P-type conductivity substrates as well can be utilized.

While the invention has been described in a specific embodiment, it will be understood that modifications, such as those described above, may be made by those skilled in the art and it is intended by the appended claims to cover all such modifications and changes as fall within the true spirit and scope of the invention.

What we claim as new and desire to secure by Letters Patent of the United States is:

1. An integrated circuit comprising:
   a substrate of semiconductor material having a major surface,
   a first surface adjacent region of said substrate containing a first part of said major surface,
   a second surface adjacent region of said substrate spaced apart from said first surface adjacent region, said second surface adjacent region containing a second part of said major surface,
   a third surface adjacent region contiguous to said first surface adjacent region and said second surface adjacent region, said third surface adjacent region containing a third part of said major surface,
   a first plurality of thin layers of silicon dioxide, each thin layer overlying a respective first surface portion of said first surface adjacent region,
   a second plurality of thin layers of silicon dioxide, each thin layer overlying a respective first surface portion of said second surface adjacent region,
   a first thick layer of silicon dioxide overlying a second surface portion of said first surface adjacent region,
   a second thick layer of silicon dioxide overlying a second surface portion of said second surface adjacent region,
   a third thick layer of silicon dioxide overlying said third part of said major surface,
   the thickness of said third thick layer of silicon dioxide being substantially greater than the thickness of said first and second thick layers,
   a first plurality of functional cells formed in said first surface adjacent region, each overlying a respective first surface portion thereof, a second plurality of functional cells formed in said second surface adjacent region, each overlying a respective first surface portion thereof, a plurality of conductive lines interconnecting elements of the functional cells located in said first surface adjacent region with the elements of the functional cells located in said second surface adjacent region, each of said conductive lines insulatingly overlying said third surface adjacent region.

* * * * *